United States Patent
Kutsukake (10) Patent No.: US 9,524,788 B1
(45) Date of Patent: Dec. 20, 2016

(54) SEMICONDUCTOR MEMORY DEVICE

(71) Applicant: Kabushiki Kaisha Toshiba, Minato-ku (JP)

(72) Inventor: Shizuka Kutsukake, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/064,998

(22) Filed: Mar. 9, 2016

Related U.S. Application Data (60) Provisional application No. 62/281,298, filed on Jan. 21, 2016.

(51) Int. Cl.

| | | |
|---|---|---|
| *G11C 16/28* | (2006.01) | |
| *G11C 16/26* | (2006.01) | |
| *G11C 5/06* | (2006.01) | |
| *H01L 27/115* | (2006.01) | |
| *H01L 29/06* | (2006.01) | |
| *G11C 11/56* | (2006.01) | |

(52) U.S. Cl.
CPC ............ *G11C 16/26* (2013.01); *G11C 5/063* (2013.01); *H01L 27/11568* (2013.01); *H01L 27/11573* (2013.01); *H01L 29/0684* (2013.01); *G11C 11/5642* (2013.01); *G11C 16/28* (2013.01)

(58) Field of Classification Search
CPC ....... G11C 16/28; G11C 16/26; G11C 11/5642
USPC ........................................ 365/185.21, 185.17
See application file for complete search history.

(56) References Cited

U.S. PATENT DOCUMENTS

| | | |
|---|---|---|
| 7,259,985 B2 | 8/2007 | Maejima et al. |
| 8,681,556 B2 | 3/2014 | Kutsukake et al. |
| 2013/0250694 A1 | 9/2013 | Kutsukake |
| 2014/0286103 A1* | 9/2014 | Akou ............ G11C 16/24 365/185.21 |

FOREIGN PATENT DOCUMENTS

| | | |
|---|---|---|
| JP | 2006-185533 | 7/2006 |
| JP | 2013-30525 | 2/2013 |
| JP | 2013-196731 | 9/2013 |
| JP | 2014-187290 | 10/2014 |

* cited by examiner

*Primary Examiner* — Jason Lappas
(74) *Attorney, Agent, or Firm* — Oblon, McClelland, Maier & Neustadt, L.L.P.

(57) ABSTRACT

A semiconductor memory device according to an embodiment includes a connecting portion having a first region between a memory cell array and a sense amplifier portion and including transistors in the first region, one of the transistors having a first terminal electrically connected to a certain memory cell and a second terminal electrically connected to the sense amplifier portion, the connecting portion including: a first transistor group configured from transistors aligned in a first direction, the first direction being as their channel width direction; and a second transistor group configured from transistors aligned in a second direction intersecting the first direction, the second direction being as their channel width direction, and one of the first terminals of the transistors of the second transistor group being disposed more inside of the first region than one of the second terminals of the transistors of the second transistor group.

20 Claims, 9 Drawing Sheets

SEMICONDUCTOR MEMORY DEVICE

CROSS-REFERENCE TO RELATED APPLICATIONS

This application is based upon and claims the benefit of priority from the prior U.S. Provisional Application 62/281,298, filed on Jan. 21, 2016, the entire contents of which are incorporated herein by reference.

BACKGROUND

Field

Embodiments of the present invention relate to a semiconductor memory device.

Description of the Related Art

One example of a semiconductor memory device is a flash memory. When erasing data in the flash memory, a high erase voltage of about 15 to 30 Vis applied to a well where a memory cell is formed. Therefore, in order to avoid a peripheral circuit being destroyed by that high erase voltage, a high withstand voltage transistor is provided between a memory cell array and the peripheral circuit.

However, in recent years, along with reduction of chip area of the flash memory, it has become difficult to secure a withstand voltage of these high withstand voltage transistors.

DETAILED DESCRIPTION

A semiconductor memory device according to an embodiment comprises: a memory cell array including a plurality of memory cells; a plurality of first wiring lines connected to the memory cells; a sense amplifier portion that detects data of one of the memory cells via one of the first wiring lines; and a connecting portion having a first region between the memory cell array and the sense amplifier portion, and including a plurality of transistors in the first region, one of the transistors having a first terminal electrically connected to a certain memory cell of the memory cells and a second terminal electrically connected to the sense amplifier portion, the connecting portion including: a first transistor group configured from a plurality of transistors aligned in a first direction, the first direction being as their channel width direction; and a second transistor group configured from a plurality of transistors aligned in a second direction intersecting the first direction, the second direction being as their channel width direction, and at least one of the first terminals of the transistors of the second transistor group being disposed more inside of the first region than at least one of the second terminals of the transistors of the second transistor group.

Semiconductor memory devices according to embodiments will be described below with reference to the drawings.

First Embodiment

First, an overall configuration of a semiconductor memory device according to a first embodiment will be described using FIG. 1. Note that in the drawings described below, the same or corresponding configurations are assigned with the same reference symbols. Moreover, although a NAND type flash memory is described here as an example, the embodiments below may be applied also to another semiconductor memory device.

A flash memory of the present embodiment comprises: a memory cell array 1; and a peripheral circuit. The peripheral circuit comprises: a row decoder 2; a sense amplifier portion 3; a bit line connection transistor portion 4 (i.e. a connecting portion); and another peripheral circuit 5.

The memory cell array 1 includes: a plurality of word lines extending in an X direction; a plurality of bit lines extending in a Y direction; and a plurality of memory cells selected by these word lines and bit lines.

Figure 1:
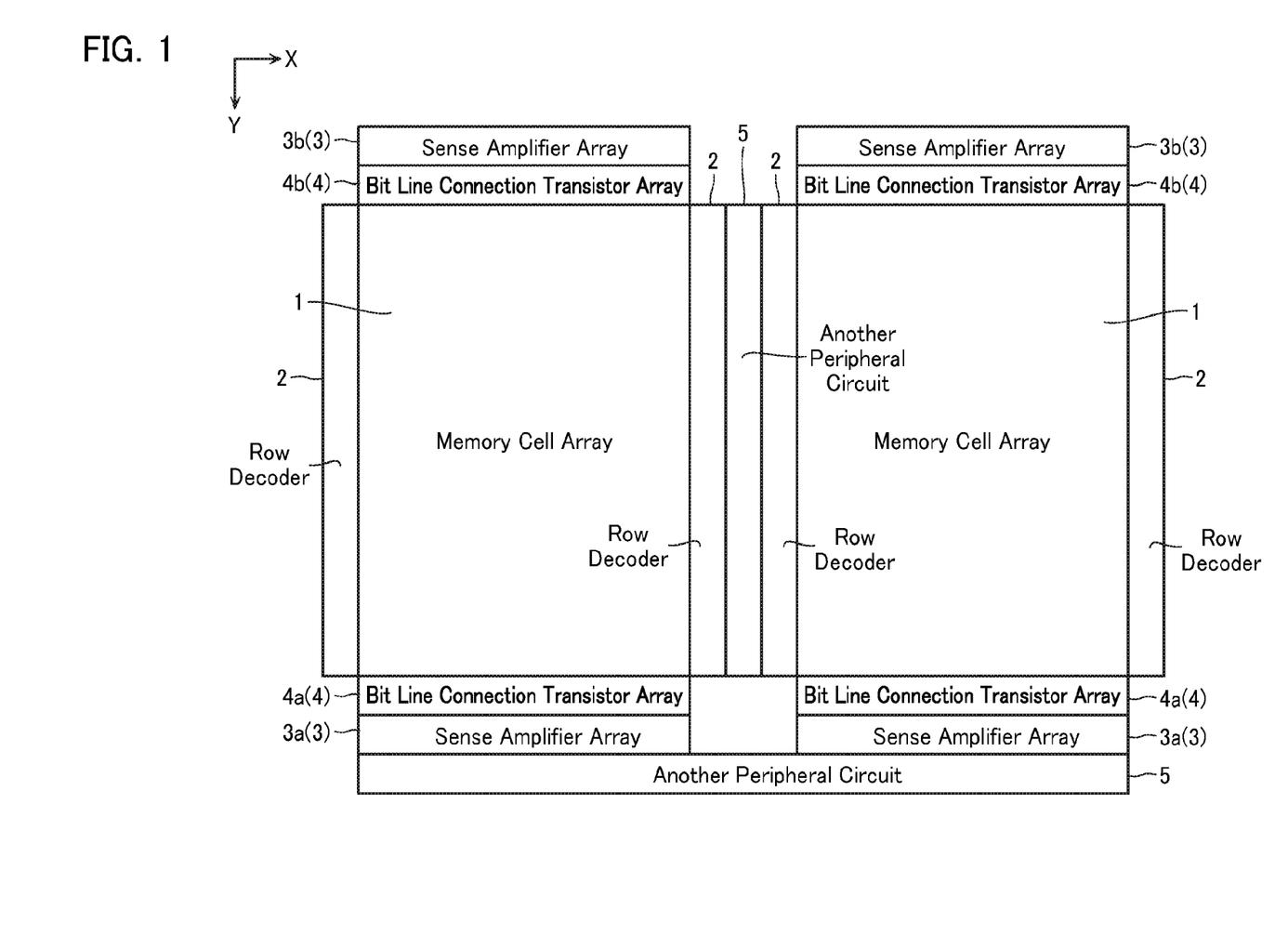
FIG. 1 is a functional block diagram of a semiconductor memory device according to a first embodiment.

In the case of the example of FIG. 1, two row decoders 2 are provided to one memory cell array 1. The two row decoders 2 are disposed at positions sandwiching the memory cell array 1 in the X direction. Each of the row decoders 2 drives a word line WL and later-mentioned select gate lines SGS and SGD of the memory cell array 1. Note that, contrary to the example of FIG. 1, the row decoder 2 may be disposed as a whole on one side in the X direction of the memory cell array 1. The sense amplifier portion 3 includes: a sense amplifier array 3a disposed on one side in the Y direction of the memory cell array 1; and a sense amplifier array 3b disposed on the other side in the Y direction of the memory cell array 1. Each of the sense amplifier arrays 3a and 3b includes a plurality of sense amplifier circuits that detect and amplify data of the memory cell via the bit line. The bit line connection transistor portion 4 includes: a bit line connection transistor array 4a disposed between the memory cell array 1 and the sense amplifier array 3a; and a bit line connection transistor array 4b disposed between the memory cell array 1 and the sense amplifier array 3b. Each of the bit line connection transistor arrays 4a and 4b includes a plurality of bit line connection transistors (hereafter, sometimes also referred to simply as "connection transistors"). Each of the connection transistors electrically connects/non-connects the bit line and the sense amplifier circuit. Note that in the case of the example of FIG. 1, one sense amplifier portion and one bit line connection transistor portion are each disposed divided into two arrays, but may each be disposed gathered in one place as one array.

The other peripheral circuit 5 comprises the likes of a logic circuit, a control circuit, and a power supply capacitor (not illustrated). The logic circuit controls input of a command and an address or input/output of data, based on a control signal. The control circuit controls an access operation such as a read operation, a write operation, and an erase operation on the memory cell array 1. The power supply capacitor is controlled by the control circuit and supplies a certain voltage required in various kinds of operations.

Figure 2:
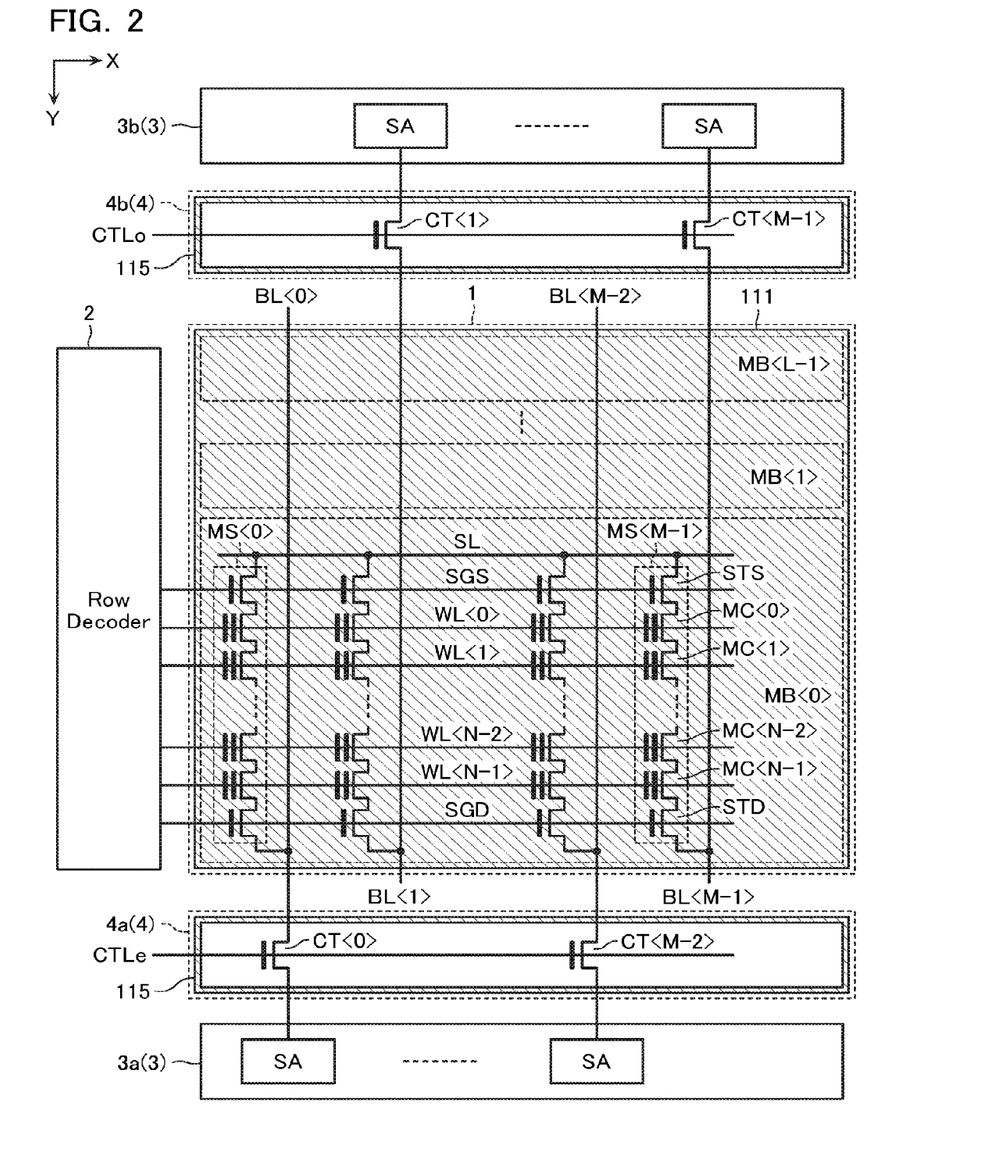
FIG. 2 is a circuit diagram of parts of a memory cell array and a bit line connection transistor portion of the semiconductor memory device according to the same embodiment.

Next, a circuit of the memory cell array 1 and the bit line connection transistor portion 4 will be described using FIG. 2.

The memory cell array 1 includes: a source line SL, a source side select gate line SGS, N word lines WL<0> to WL<N−1>, and a drain side select gate line SGD that extend in the X direction; and M bit lines BL<0> to BL<M−1> and M memory strings MS<0> to MS<M−1> that extend in the Y direction. Each memory string MS includes: N memory cells MC<0> to MC<N−1> connected in series; and a source side select gate transistor STS and a drain side select gate transistor STD connected to both ends of the N memory cells MC<0> to MC<N−1>. Each memory cell MC is configured as a transistor having a channel above a semiconductor substrate, a charge accumulation layer disposed above the channel, and a control gate disposed above the charge accumulation layer. Hereafter, the memory cell MC is sometimes also referred to as "memory transistor MT". Moreover, the source side select gate transistor STS and the drain side select gate transistor STD are sometimes also referred to as "select gate transistor ST".

A source of the source side select gate transistor STS is connected to the source line SL. A drain of the drain side select gate transistor STD is connected to one of the bit lines BL<0> to BL<M−1>. Control gates of the memory cells MC<0> to MC<N−1> are connected to the word lines WL<0> to WL<N−1>. Gates of the source side select gate transistor STS and the drain side select gate transistor STD are connected to the source side select gate line SGS and the drain side select gate line SGD. The word lines WL, the source side select gate line SGS, and the drain side select gate line SGD are driven by the row decoder 2. Note that when there are two row decoders 2 for every one memory cell array 1 as in FIG. 1, for example, the word lines WL, and so on, of memory blocks MB<e> (where e is an even number between 0 and L−1) aligned in even number positions may be connected to one of the row decoders 2, and the word lines WL, and so on, of memory blocks MB<o> (where o is an odd number between 0 and L−1) aligned in odd number positions may be connected to the other of the row decoders 2.

In the above-described configuration, the M memory strings MS aligned in the X direction configure one memory block MB. This memory block MB is a unit of batch erase of data. In the case of FIG. 2, the memory cell array 1 includes L memory blocks MB<0> to MB<L−1> aligned in the Y direction. Note that the plurality of memory blocks MB are formed above a p type impurity well 111 shown by slanting lines of FIG. 2.

As previously mentioned, the bit line connection transistor portion 4 includes the two bit line connection transistor arrays 4a and 4b. The bit line connection transistor arrays 4a and 4b include M connection transistors CT<0> to CT<M−1>. Of these, the connection transistors CT<e> (where e is an even number between 0 and M−1) are included in the bit line connection transistor array 4a, and are on/off controlled by a connection transistor control line CTLe. On the other hand, the connection transistors CT<o> (where o is an odd number between 0 and M−1) are included in the bit line connection transistor array 4b, and are on/off controlled by a connection transistor control line CTLo. Each of the connection transistors CT<m> (where m is an integer of 0 to M−1) electrically connects each of respectively corresponding bit lines BL<m> and a sense amplifier circuit SA (3a and 3b). Note that the connection transistors CT of the bit line connection transistor arrays 4a and 4b are surrounded by a p type impurity well 115 shown by slanting lines of FIG. 2.

Next, a bias relationship of the memory cell array 1 and the bit line connection transistor portion 4 (bit line connection transistor array 4a) during the access operation, will be described.

First, in the read operation on the memory cell MC, a cell current flowing when a read voltage is provided to a gate of the memory cell MC, is detected and amplified by the sense amplifier circuit SA, whereby it is determined whether data written to the memory cell MC is '0' or '1'. Since the sense amplifier circuit SA enables on/off control to be performed at high speed at an internal voltage Vdd (for example, about 1.5 to 3.3 V), it uses a transistor having a comparatively thin film gate insulating film of a film thickness of about 1 to 10 nm.

Next, in the erase operation on the memory block MB, an erase voltage Vera is applied to the p type impurity well where the word line WL and the memory cell MC are disposed. The p type impurity well is a well doped with a p type impurity. The erase voltage Vera is generated by boosting an external voltage Vcc.

Next, a withstand voltage of the transistors of the memory cell array 1 and the bit line connection transistor portion 4 during the erase operation, will be explained using FIG. 3.

Figure 3:
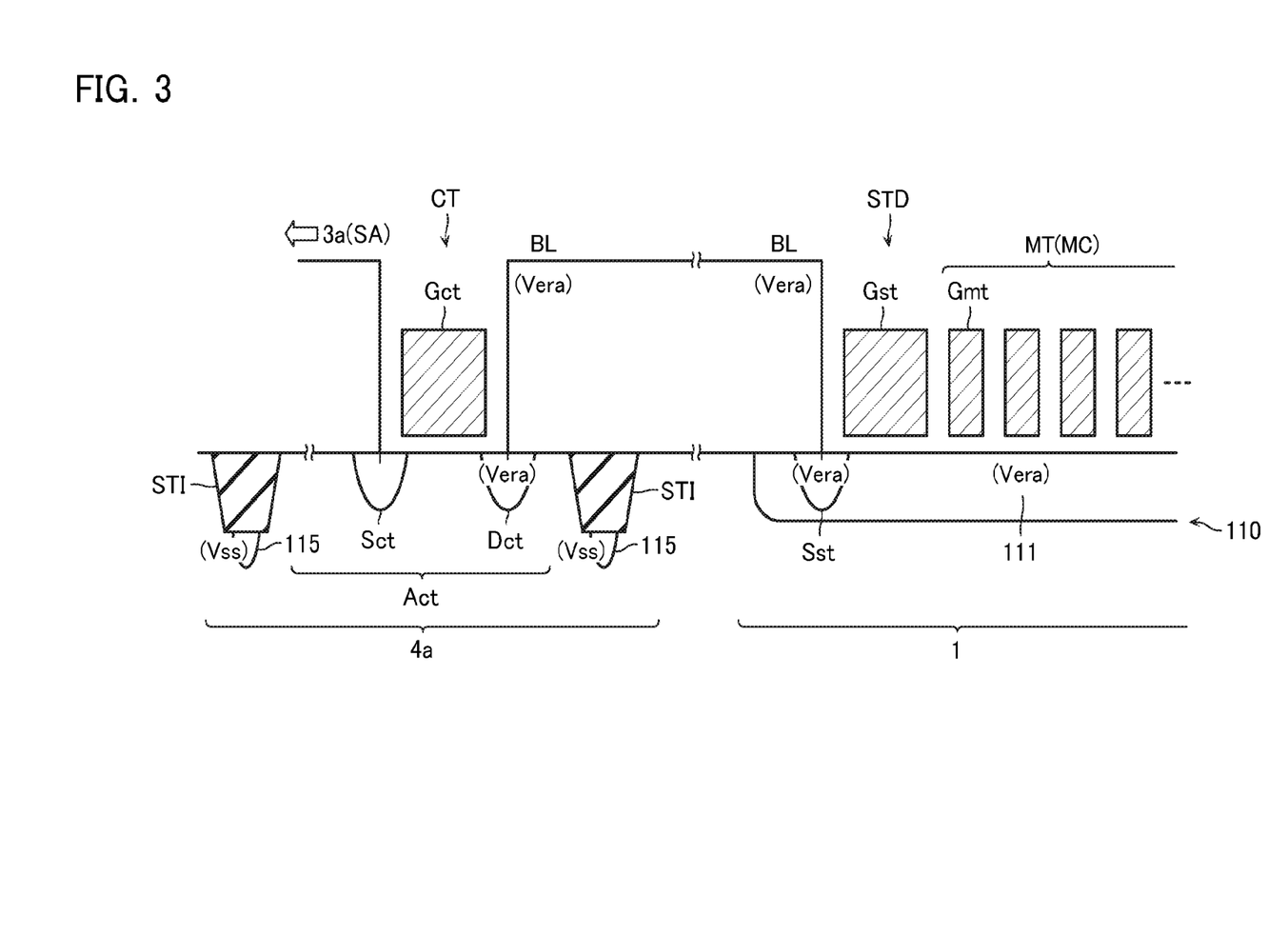
FIG. 3 is a schematic view showing an arrangement of transistors of the memory cell array and the bit line connection transistor portion of the semiconductor memory device according to the same embodiment.

FIG. 3 shows the following, from right to left of the paper surface, namely: a plurality of the memory transistors MT (memory cells MC) and the select gate transistor STD which are disposed in the memory cell array 1; and the connection transistor CT which is disposed in the bit line connection transistor array 4a. The memory transistor MT including a gate electrode Gmt and the select gate transistor STD including a gate electrode Gst are provided above the p type impurity well 111. Moreover, a source diffusion layer Sst doped in high concentration with an n type impurity is disposed in an upper surface of the p type impurity well 111, on a source side of the select gate transistor STD. The connection transistor CT including a gate electrode Gct is provided in an arrangement region Act whose periphery is surrounded by the p type impurity well 115. The p type impurity well 115 is a well applied with a power supply voltage Vss in order to isolate the connection transistor CT and the transistor of the memory cell array 1 or the other peripheral circuit, and the p type impurity well 115 is disposed on a lower side of an element isolation trench STI. Note that the p type impurity well 115 is doped at a concentration of $1\times10^{14}$ to $1\times10^{18}/cm^3$ with a p type impurity of the likes of boron (B), for example, and has a depth of up to 2 μm. In addition, a source diffusion layer Sct doped in high concentration with an n type impurity is disposed in an upper surface of a semiconductor substrate 110, on a source (first terminal) side of the connection transistor CT. This source diffusion layer Sct is electrically connected to a low withstand voltage transistor configuring the sense amplifier circuit SA of the sense amplifier array 3a. On the other hand, a drain diffusion layer Dct doped with an n type impurity is disposed in the upper surface of the semiconductor substrate 110, on a drain (second terminal) side of the connection transistor CT. This drain diffusion layer Dct is electrically connected to the source diffusion layer Sst of the select gate transistor STD, via the bit line BL. Note that FIG. 3 describes the bit line connection transistor array 4*a*, but the same applies also to the bit line connection transistor array 4*b*.

Now, when performing the erase operation, as shown in FIG. 3, the erase voltage Vera of, for example, about 15 to 30 V is applied to the p type impurity well 111. In this case, a voltage Vb1 of the bit line BL electrically connected to the p type impurity well 111 is also boosted at most to the erase voltage Vera by influence of coupling. In order to detect a cell current flowing in the memory cell MC by the sense amplifier circuit SA, electrical connection must be made between the bit line BL and the sense amplifier circuit SA. However, the gate insulating film of the transistor employed in the sense amplifier circuit SA is a thin film of about 1 to 10 nm, as previously mentioned. If a transistor having such a thin film gate insulating film is electrically connected to the source diffusion layer Sst of the select gate transistor STD, then a voltage of at most about the erase voltage Vera is applied to this transistor via the bit line BL, thereby causing a risk of withstand voltage breakdown of this transistor. Accordingly, the high withstand voltage connection transistor CT which is not broken down even when applied with the erase voltage Vera, is provided between the sense amplifier circuit SA and the drain side select gate transistor STD. As a result, withstand voltage breakdown of the transistor of the sense amplifier circuit SA can be prevented. Now, a film thickness of a gate insulating film of the connection transistor CT may be configured to be, for example, about 13 to 40 nm, such that a withstand voltage defect is prevented from occurring even when the erase voltage (for example, a voltage of 15V or more) from the bit line BL is applied to the drain diffusion layer Dct.

However, there is concern about withstand voltage breakdown and leak current increase accompanying size reduction of the connection transistor CT. When leak current increases, it becomes impossible to boost the erase voltage Vera to a desired voltage for the following reason. A boost circuit of a peripheral circuit supplies a charge to the p type impurity well 111 of the memory transistor MT in order to boost the erase voltage Vera, but when the leak current of the connection transistor CT is large, the charge supplied from the boost circuit ends up escaping to the semiconductor substrate 110 and it becomes difficult for the erase voltage Vera to be boosted to a desired value. Generally, the memory transistor MT undergoes an increase in electrons trapped in its tunnel insulating film and becomes difficult to be erased as the number of times of rewrites increases. In other words, a higher erase voltage Vera becomes required to complete the erase operation in the same erase time. From the above, in order to achieve a memory transistor MR guaranteeing high reliability, it is desirable for a higher erase voltage Vera to be outputted from the peripheral circuit, and for that, it is desirable to achieve a connection transistor CT of higher withstand voltage. However, in recent years, area of the memory cell array 1 has been tending to be reduced, and it has been getting difficult to secure a withstand voltage of the connection transistor CT.

Next, a physical mechanism of withstand voltage deterioration and leak current increase of the connection transistor CT occurring due to the erase operation, will be described using FIG. 4.

Figure 4:
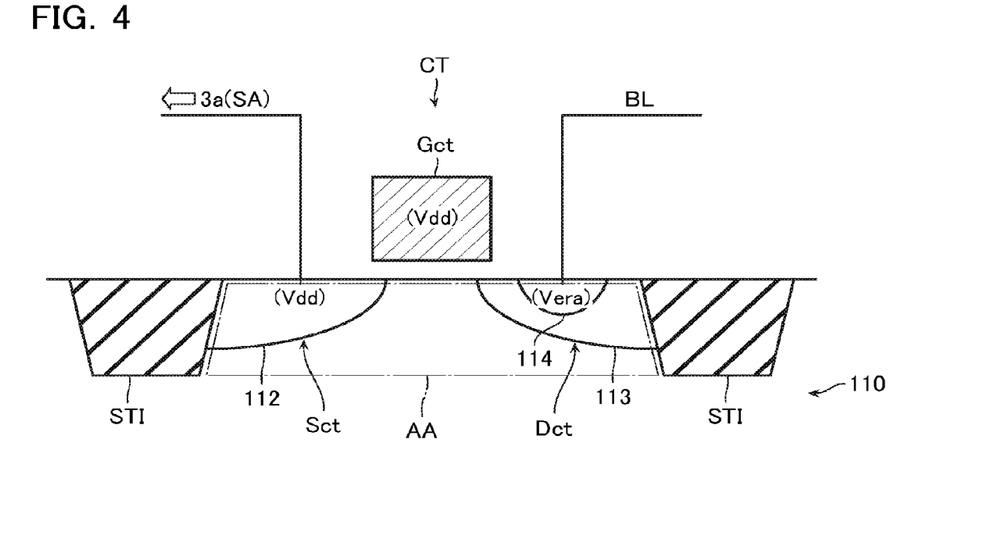
FIG. 4 is a view showing a bias state of a bit line connection transistor during an erase operation in the semiconductor memory device according to the same embodiment.

FIG. 4 shows the connection transistor CT formed on an active area AA between two element isolation trenches STI, of the semiconductor substrate 110. Now, the active area AA is doped with a p type impurity. The connection transistor CT includes the gate electrode Gct disposed on the active area AA via a gate insulating film (not illustrated). In addition, the source diffusion layer Sct of the connection transistor CT includes an n+ type impurity region 112 doped in high concentration with an n type impurity. On the other hand, the drain diffusion layer Dct of the connection transistor CT includes: an n− type impurity region 113 doped in low concentration with an n type impurity; and an n+ type impurity region 114 disposed within this n− type impurity region 113 and doped in high concentration with an n type impurity. A concentration of the p type impurity of the n− type impurity region 113 is lower than a concentration of the p type impurity of the n+ type impurity region 114.

As previously mentioned, in the erase operation, the erase voltage Vera of, for example, about 15 to 30 V is applied to the p type impurity well where the memory transistor is formed. In this case, the voltage Vb1 of the bit line BL also rises by coupling, and a voltage of about the erase voltage Vera is applied between the drain diffusion layer Dct of the connection transistor CT and the active area AA. On the other hand, the source diffusion layer Sct and the gate electrode Gct are applied with the internal voltage Vdd. Therefore, there is an increase in potential difference between the drain diffusion layer Dct and the active area AA, between the drain diffusion layer Dct and the gate electrode Gct, and between the drain diffusion layer Dct and the source diffusion layer Sct. In particular, a surface of the drain diffusion layer Dct attains a high electric field, hence withstand voltage deterioration or increase in leak current of the connection transistor CT also sometimes occur.

Accordingly, in the present embodiment, in order to suppress withstand voltage deterioration and leak current increase with respect to the erase voltage Vera of the connection transistor CT, a layout of connection transistors CT within the bit line connection transistor portion 4 is devised.

Figure 5:
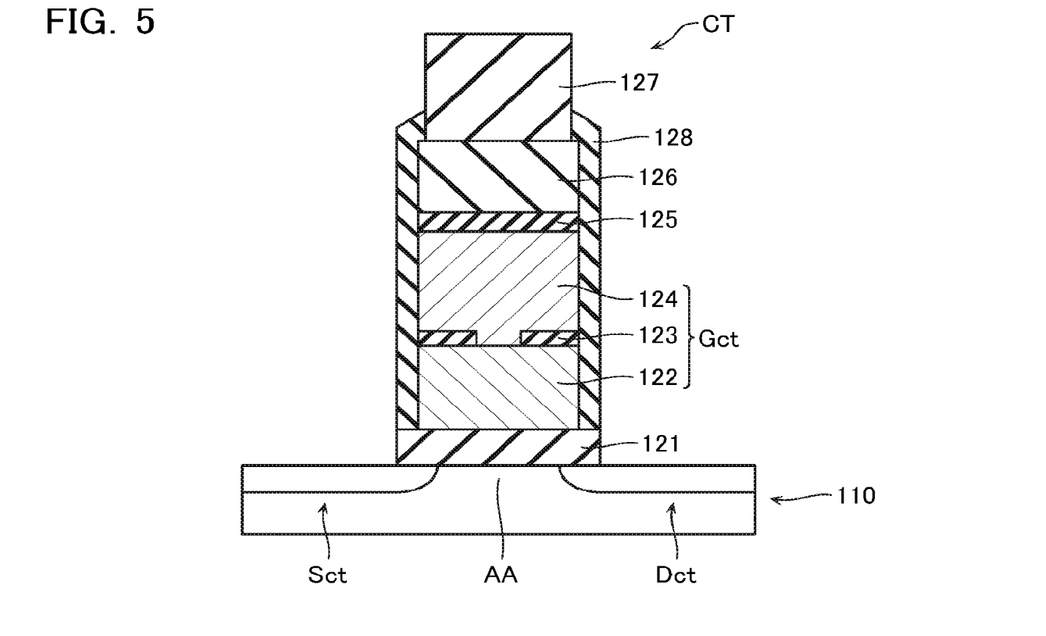
FIG. 5 is a cross-sectional view showing a structure of the bit line connection transistor of the semiconductor memory device according to the same embodiment.
Figure 6:
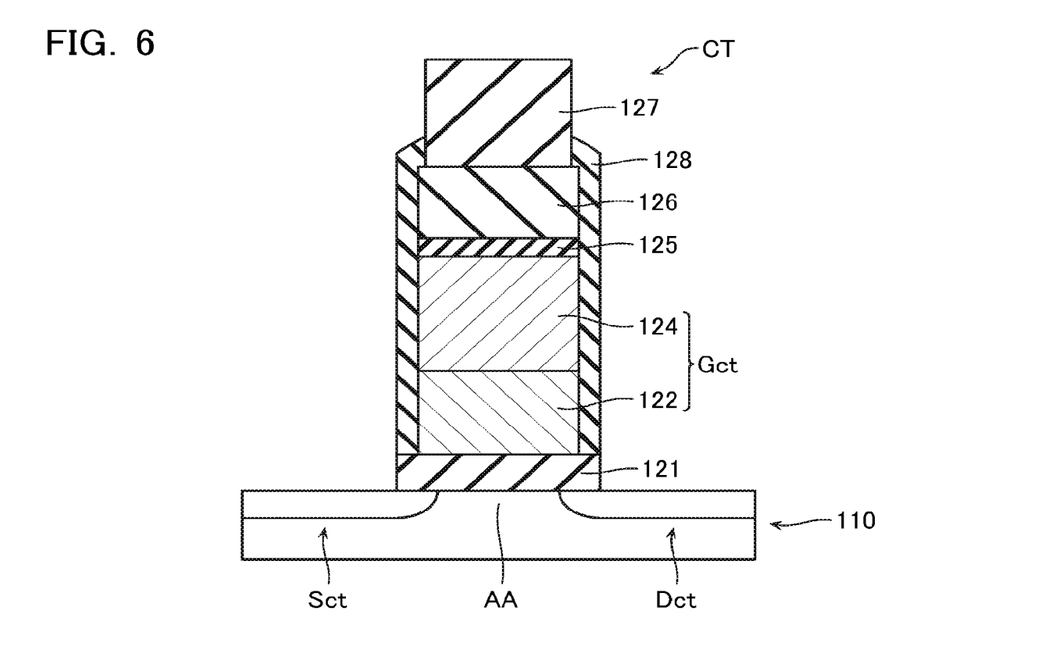
FIG. 6 is a cross-sectional view showing another structure of the bit line connection transistor of the semiconductor memory device according to the same embodiment.

Before describing a layout of the bit line connection transistor portion 4, first, a structure of the connection transistor CT will be described using the cross-sectional views of FIGS. 5 and 6.

The connection transistor CT is an n type MOSFET high voltage transistor formed on the active area AA of the semiconductor substrate 110. A high voltage transistor is a transistor having a tolerance that prevents an insulation breakdown from occurring even when a voltage of 15 V or more is supplied between the gate electrode Gct and the source diffusion layer Sct or the drain diffusion layer Dct. The active area AA is a region which is in a range of a depth of 1 μm from a surface of the semiconductor substrate 110, for example, and which is doped at a concentration of $1 \times 10^{14}$ to $5 \times 10^{16}$/cm$^3$ with a p type impurity such as boron (B).

The connection transistor CT includes the following, stacked on the active area AA, namely: a high voltage gate insulating film 121; a gate electrode 122; an interpoly insulating film 123; and a gate electrode 124. The gate electrodes 122 and 124 are connected via an opening of the interpoly insulating film 123 provided between these electrodes, and are the gate electrode Gct. The interpoly insulating film 123 is a film formed in relation to a structure of the memory transistor MT, and may also be omitted as in FIG. 6.

The high voltage gate insulating film 121 is formed by a silicon oxide film ($SiO_x$) or silicon oxynitride film ($SiN_xO_y$) having a film thickness of 13 to 40 nm, for example. The gate electrode 122 is formed by conductive polysilicon (Poly-Si) having a film thickness of 30 to 120 nm, for example, and to which phosphorus (P), arsenic (As), or boron (B) has been added at a concentration of $1\times10^{18}/cm^3$ to $1\times10^{21}/cm^3$. The interpoly insulating film 123 is formed by a silicon oxide film ($SiO_x$)-silicon nitride film ($SiN_x$)-silicon oxide film ($SiO_x$), silicon nitride film ($SiN_x$)-silicon oxide film ($SiO_x$)-silicon nitride film ($SiN_x$)-silicon oxide film ($SiO_x$)-silicon nitride film ($SiN_x$), silicon oxide film ($SiO_x$)—$AlO_x$ film-silicon oxide film ($SiO_x$), silicon oxide film ($SiO_x$)—$HfAlO_x$ film-silicon oxide film ($SiO_x$), silicon oxide film ($SiO_x$)—$HfO_x$ film-silicon oxide film ($SiO_x$), or silicon oxide film ($SiO_x$) having an overall film thickness of 2 to 30 nm, for example; alternatively, the interpoly insulating film 123 is formed by a polysilicon film (Poly-Si) having a film thickness of 10 nm to 100 nm, for example. The gate electrode 124 is configured by, for example, tungsten nitride (WN) having a film thickness of 2 to 40 nm, and tungsten (W) having a film thickness of 10 to 100 nm stacked on the tungsten nitride.

In addition, the connection transistor CT includes the source diffusion layer Sct and the drain diffusion layer Dct formed close to a surface of the active area AA. The source diffusion layer Sct includes the n+ type impurity region 112. The n+ type impurity region 112 is doped with phosphorus (P), arsenic (As), or antimony (Sb) at a surface concentration of $1\times10^{19}$ to $1\times10^{22}/cm^3$, for example. The drain diffusion layer Dct includes the n− type impurity region 113 and the n+ type impurity region 114, as shown in FIG. 4. The n− type impurity region 113 is doped with phosphorus (P), arsenic (As), or antimony (Sb) at a surface concentration of $1\times10^{17}$ to $1\times10^{19}/cm^3$, for example, and a junction depth of the n− type impurity region 113 is 10 to 300 nm. The n− type impurity region 113 is formed in a self-aligning manner with respect to a later-mentioned gate sidewall insulating film 128. The n+ type impurity region 114 is doped with phosphorus (P), arsenic (As), or antimony (Sb) at a surface concentration of $1\times10^{19}$ to $1\times10^{22}/cm^3$, for example, and a junction depth of the n+ type impurity region 114 is 10 to 300 nm. Moreover, the n+ type impurity region 114 is surrounded by the n− type impurity region 113 in a range of depth of 0.05 to 2 μm.

The above is the basic structure of the connection transistor CT, but the connection transistor CT includes the following, as required, namely: agate electrode cap material 125, a mask material 126, and an insulating film 127 that are stacked on the gate electrode 124; and the gate sidewall insulating film 128 that covers a side surface from the gate electrode 122 to a lower portion of the insulating film 127. The gate electrode cap material 125 is formed by a silicon nitride film ($SiN_x$) having a film thickness of 2 to 100 nm, for example. The mask material 126 is formed by a silicon oxide film ($SiO_2$) or silicon nitride film (SiN) having a film thickness of 2 to 100 nm, for example. The insulating film 127 is formed by a silicon oxide film ($SiO_2$) or silicon nitride film (SiN) having a film thickness of 2 to 100 nm, for example. The gate sidewall insulating film 128 is formed by a silicon oxide film ($SiO_2$) or silicon nitride film (SiN), or by a stacked film of those films, having a film thickness of 10 to 100 nm, for example.

Next, the layout of the bit line connection transistor portion 4 (bit line connection transistor arrays 4a and 4b) of the present embodiment will be described using FIGS. 7, 9, and 10. FIG. 10 is a view enlarging the region a1 surrounded by a broken line in FIG. 9.

Figure 7:
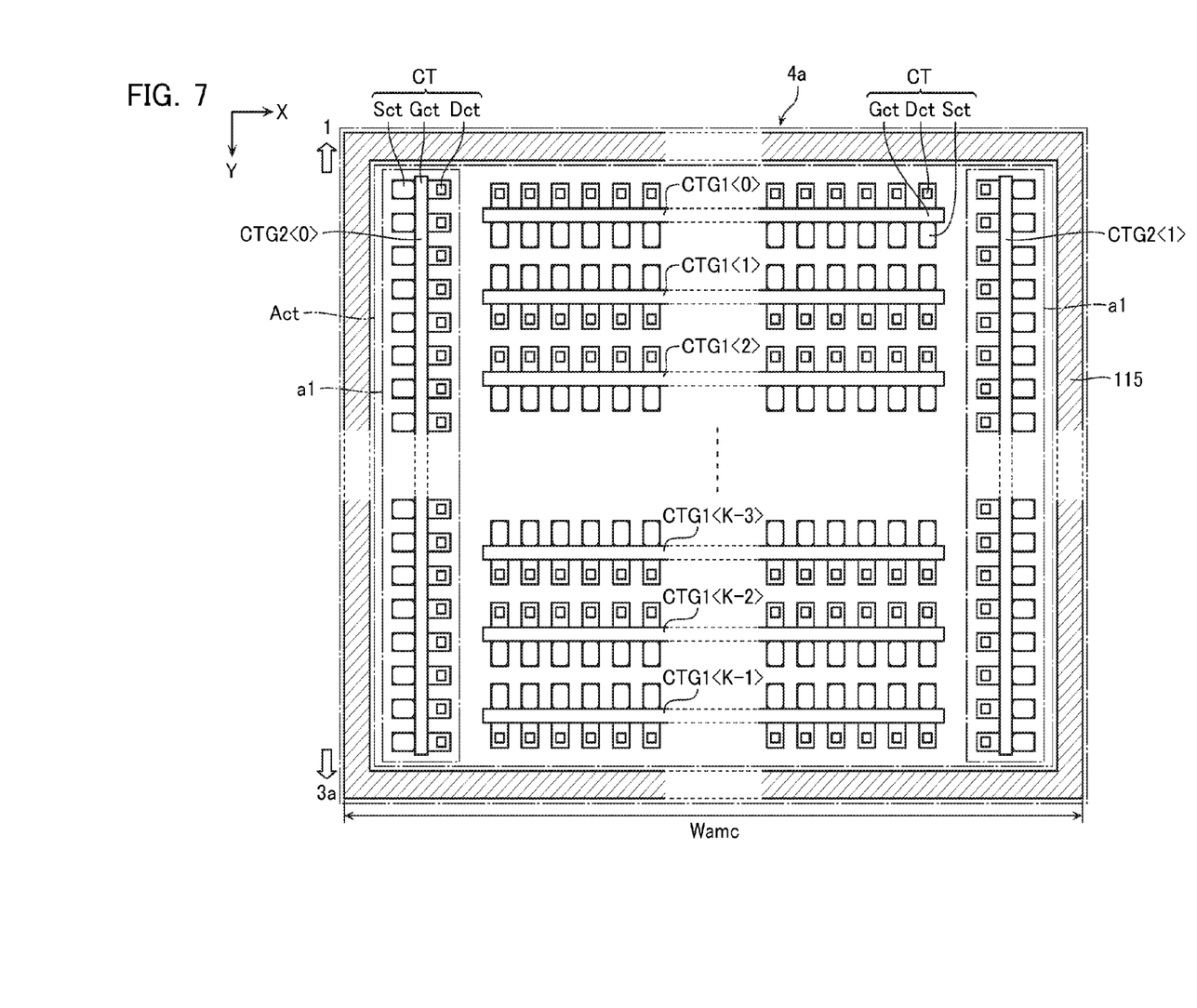
FIG. 7 is a view showing a layout of a bit line connection transistor array of the semiconductor memory device according to the same embodiment.

As shown in FIG. 7, for example, the bit line connection transistor array of the present embodiment (4a in the case of FIG. 7) is disposed in the roughly rectangular arrangement region Act surrounded by the p type impurity well 115 (slanting line portion in FIG. 7).

The bit line connection transistor array 4a includes a plurality of connection transistor groups each configured from a plurality of the connection transistors CT. Included in these connection transistor groups are a plurality of first connection transistor groups CTG1<0> to CTG1<K−1> aligned in the Y direction, and, at ends in the X direction of the arrangement region Act, two second connection transistor groups CTG2<0> and CTG2<1> disposed so as to sandwich the first connection transistor groups CTG1<0> to CTG1<K−1> from the X direction. Each of the first connection transistor groups CTG1 is configured from a plurality of the connection transistors CT aligned in the X direction and having the X direction as their channel width direction. The connection transistors CT of the first connection transistor group CTG1 share the integrally formed gate electrode Gct extending in the X direction. On the other hand, each of the second connection transistor groups CTG2 is configured from a plurality of the connection transistors CT aligned in the Y direction and having the Y direction as their channel width direction. The connection transistors CT of the second connection transistor group CTG2 share the integrally formed gate electrode Gct extending in the Y direction. Furthermore, all of the connection transistors CT of the second connection transistor group CTG2 are disposed such that their drain (drain diffusion layer Dct) is more to the inside of the arrangement region Act than is their source (source diffusion layer Sct), such that their drain is more distant from the p type impurity well 115 than is their source. Note that the gate electrodes Gct of all of the connection transistor groups of the bit line connection transistor array 4a are electrically connected.

Figure 9:
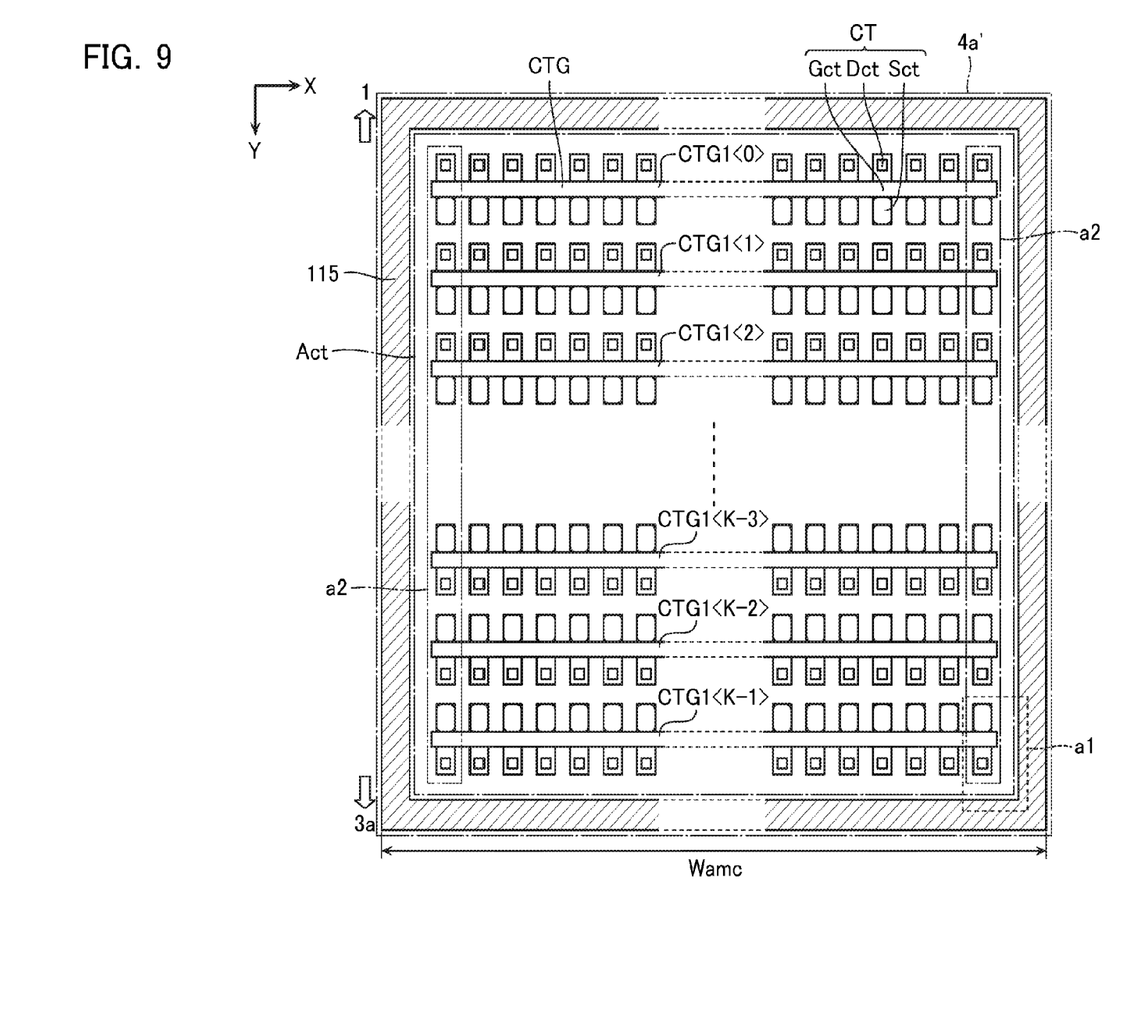
FIG. 9 is a view showing a layout of a bit line connection transistor array of a semiconductor memory device according to a comparative example.
Figure 10:
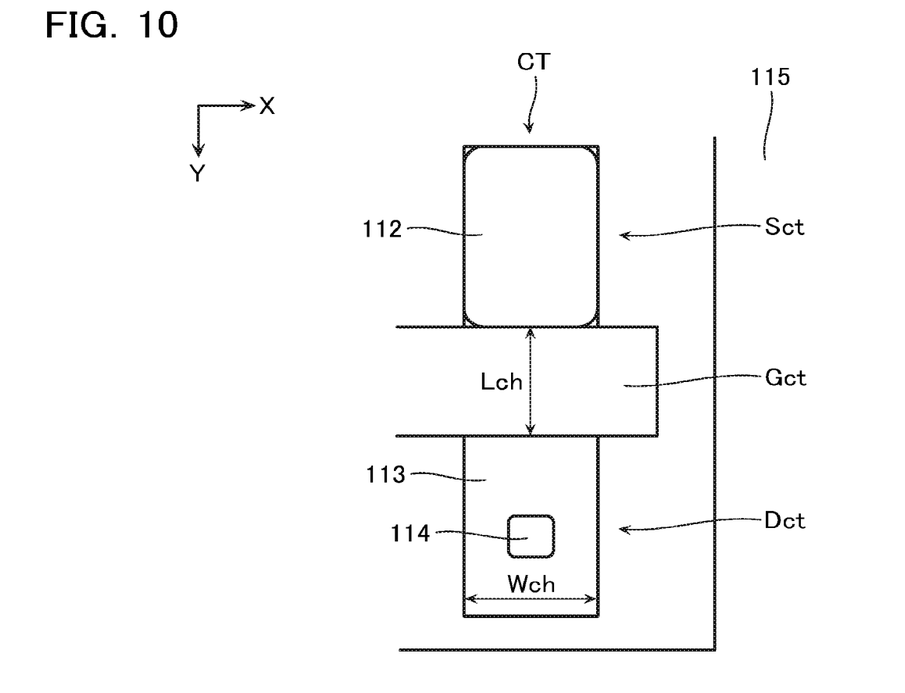
FIG. 10 is a view showing a layout of a bit line connection transistor of the semiconductor memory device according to the same comparative example.

In contrast, a bit line connection transistor array 4a' of a comparative example shown in FIG. 9 has a layout in which connection transistor groups CTG<0> to CTG<K−1> having a similar configuration to the first connection transistor group CTG1 of the present embodiment are simply arranged in the Y direction.

Generally, in order to eliminate variation between individual connection transistors CT, it is desirable to match a channel length Lch or channel width Wch of each of the connection transistors CT (shown in FIG. 10) and an inter-element distance between the connection transistors CT, and to dispose in a more regular matrix. However, the bit line connection transistor array 4a has a restriction of a memory cell array width Wamc as shown in FIGS. 7 and 9, hence the channel width Wch of each of the connection transistors CT must be suppressed to about 0.4 to 1.2 μm, and the inter-element distance between the connection transistors CT must be suppressed to about 0.3 to 1 μm. Therefore, the connection transistor CT is compelled to have its size made smaller compared to that of a high voltage transistor employed in the other peripheral circuit, and as a result, it is not easy for a withstand voltage to the erase voltage Vera to be secured. In particular, the connection transistor CT in an outermost periphery of the arrangement region Act, when compared to another connection transistor CT disposed more inwardly, is proportionately more influenced by a concentration distribution of the p type impurity well 115 at a lower end of the element isolation trench STI (here, a concentration distribution of boron (B)) the closer it is to this well 115. In other words, along with application of the erase voltage Vera to the memory cell (p type impurity well 111), the outermost peripheral connection transistor CT has its n type drain diffusion layer Dct also applied with the erase voltage Vera via the bit line BL, and its depletion layer increases. At this time, a concentration gradient from the drain diffusion layer Dct to the p type impurity well 115 at the lower end of the element isolation trench STI is increased due to the existence of the p type impurity well 115, hence increase of the depletion layer is suppressed whereby a high electric field more easily occurs. As a result, there is concern about deterioration of withstand voltage or worsening of leak defects of the connection transistor CT which is rate-controlled by magnitude of the depletion layer. In other words, if a distance between the drain diffusion layer Dct connected to the bit line BL, of the connection transistor CT, and the p type impurity well 115, is increased, it becomes easier for the depletion layer of the connection transistor CT to extend, whereby the withstand voltage of the connection transistor CT becomes more easily secured.

Looking at the connection transistor array 4a' of the comparative example in view of the above points, in particular, the connection transistors CT at both ends of each of the connection transistor groups CTG surrounded by the dot-chain lines a2 in FIG. 9 have a small distance between their drain diffusion layer Dct and the p type impurity well 115 and are considered to have a most weakened withstand voltage.

In this regard, in the present embodiment, the connection transistors CT corresponding to the connection transistors CT surrounded by the dot-chain lines a2 in FIG. 9 are gathered in the second connection transistor groups CTG2 extending in the Y direction surrounded by the dot-chain lines a1 in FIG. 7, and furthermore, are disposed such that the drain diffusion layer Dct of each of the connection transistors CT is on the inside of the arrangement region Act. Doing so makes it possible to increase the distance between the p type impurity well 115 and the drain diffusion layer Dct of the connection transistor CT disposed most outwardly in the X direction and closest to the p type impurity well 115. As a result, it is made easier to secure withstand voltage of at least the connection transistor CT most outward in the X direction, compared to in the comparative example.

As is clear from the above, the present embodiment makes it possible to improve leak defects and deterioration in withstand voltage with respect to the erase voltage Vera, of the connection transistor CT, and provide a highly reliable semiconductor memory device.

Note that in the example of FIG. 7, both of the connection transistors CT disposed most outwardly in the X direction of the arrangement region Act had their drain side disposed separated from the p type impurity well 115, but it is also possible for only the connection transistors CT on one side to be disposed in this way.

Second Embodiment

A second embodiment describes an application example of the first embodiment. Herein, different points from the first embodiment will now be described with using FIG. 8.

Figure 8:
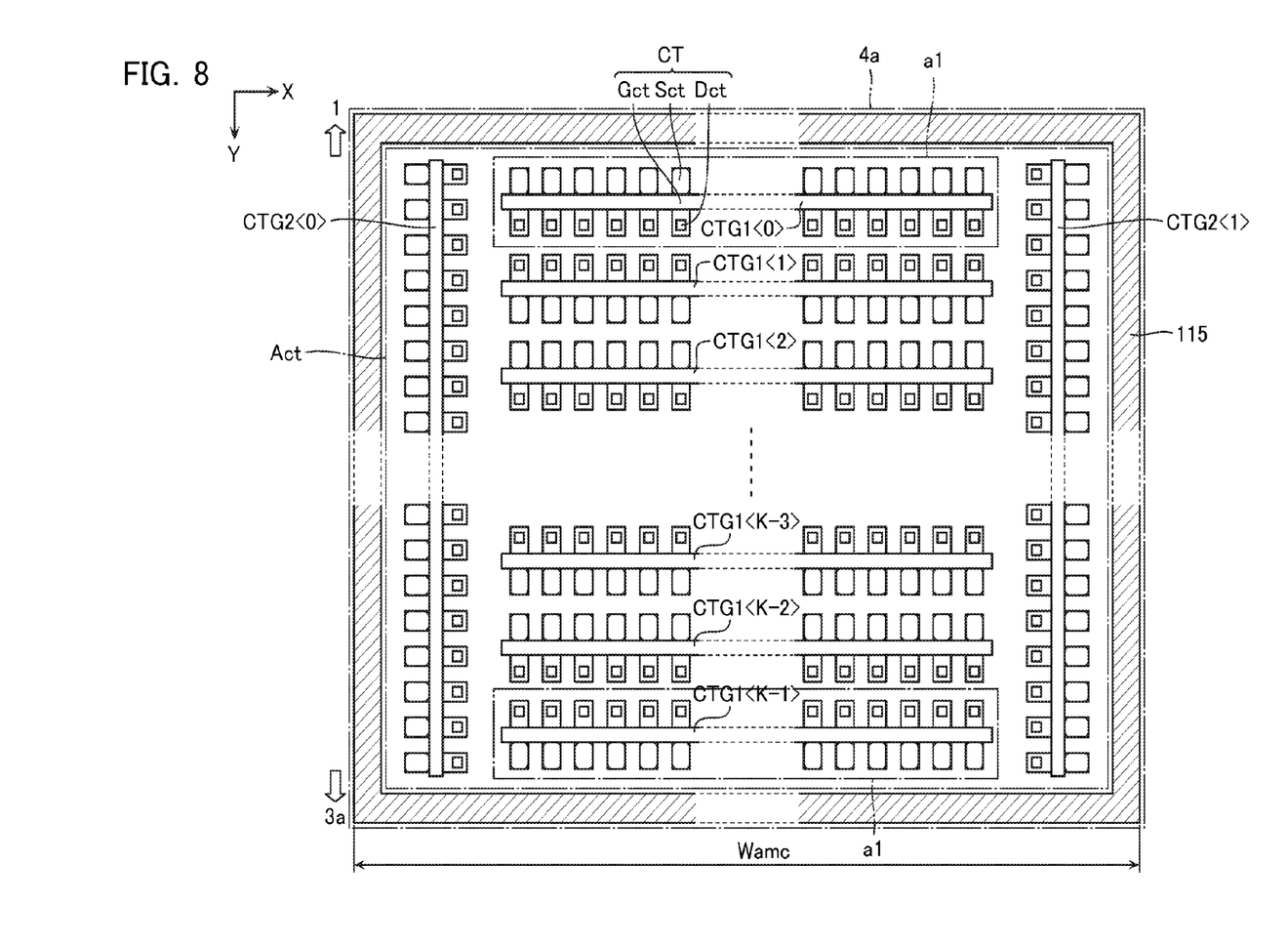
FIG. 8 is a view showing a layout of a bit line connection transistor array of a semiconductor memory device according to a second embodiment.

In the first embodiment, as shown by the dot-chain lines a1 in FIG. 8, the first connection transistor groups CTG1<0> and CTG1<K−1> disposed most outwardly in the Y direction of the arrangement region Act among the groups CTG1 are also modified in addition to the configuration of the first embodiment. That is, their drain (drain diffusion layer Dct) is disposed more to the inside of the connecting portion 4a than their source (source diffusion layer Sct). Thus, the first connection transistor groups CTG1<0> and CTG1<K−1> disposed most outwardly in the Y direction can also have the distance between their drain diffusion layer Dct and the p type impurity well 115 set large. As a result, withstand voltage is easily secured not only for the connection transistors CT disposed most outwardly in the X direction of the arrangement region Act, but also for the connection transistors CT disposed most outwardly in the Y direction of the arrangement region Act.

In other words, the present embodiment makes it possible to provide a semiconductor memory device of even higher reliability compared to the first embodiment.

Note that in the example of FIG. 8, both of the two first connection transistor groups CTG1 disposed most outwardly in the Y direction of the arrangement region Act had a drain side of their connection transistors CT disposed separated from the p type impurity well 115, but it is also possible for only the connection transistors CT of one of the connection transistor groups CTG1 to be disposed in this way.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array including a plurality of memory cells;
a plurality of first wiring lines connected to the memory cells;
a sense amplifier portion that detects data of one of the memory cells via one of the first wiring lines; and
a connecting portion having a first region between the memory cell array and the sense amplifier portion, and including a plurality of transistors in the first region, one of the transistors having a first terminal electrically connected to a certain memory cell of the memory cells and a second terminal electrically connected to the sense amplifier portion,
the connecting portion including: a first transistor group configured from transistors of the plurality of transistors that are aligned in a first direction, the first direction being as their channel width direction; and a second transistor group configured from transistors of the plurality of transistors that are aligned in a second direction intersecting the first direction, the second direction being as their channel width direction, and
at least one of first terminals of the transistors of the second transistor group being disposed more inside of the first region than at least one of second terminals of the transistors of the second transistor group.

2. The semiconductor memory device according to claim 1, wherein at least one of first terminals of the transistors of the first transistor group is disposed more inside of the first region than at least one of second terminals of the transistors of the first transistor group.

3. The semiconductor memory device according to claim 1, wherein the connecting portion has a first impurity region, the first impurity region surrounding the first region and including an impurity of a first conductivity type.

4. The semiconductor memory device according to claim 1, wherein
one of the transistors of the connecting portion includes:
a gate electrode;
a second impurity region and a third impurity region that are disposed on a first terminal side of the gate electrode, the second impurity region including an impurity of a second conductivity type different from a first conductivity type of a first impurity region surrounding the first region, and the third impurity region including an impurity of the second conductivity type in a lower concentration than does the second impurity region; and
a fourth impurity region disposed on a second terminal side of the gate electrode and including an impurity of the second conductivity type.

5. The semiconductor memory device according to claim 1, wherein
the sense amplifier portion includes: a first sense amplifier array disposed on one side in the second direction of the memory device; and a second sense amplifier array disposed on the other side in the second direction of the memory device, and
the connecting portion includes: a first connecting portion disposed between the memory cell array and the first sense amplifier array; and a second connecting portion disposed between the memory cell array and the second sense amplifier array.

6. The semiconductor memory device according to claim 1, wherein
the memory cell array is divided into a plurality of memory cell blocks aligned in the second direction, and
the connecting portion is shared by the memory cell blocks.

7. The semiconductor memory device according to claim 1, wherein the connecting portion includes a plurality of the first transistor groups.

8. The semiconductor memory device according to claim 1, wherein the connecting portion includes a plurality of the second transistor groups.

9. The semiconductor memory device according to claim 8, wherein the second transistor groups sandwich the first transistor group in the second direction and are disposed at both ends of the first region.

10. The semiconductor memory device according to claim 1, wherein
one of the transistors of the connecting portion includes a gate electrode,
the gate electrodes of the transistors of the first transistor group are integrated, and
the gate electrodes of the transistors of the second transistor group are integrated.

11. The semiconductor memory device according to claim 10, wherein the gate electrodes of the transistors of the first transistor group are electrically connected to the gate electrodes of the transistors of the second transistor group.

12. A semiconductor memory device, comprising:
a memory cell array including a plurality of memory cells;
a plurality of first wiring lines connected to the memory cells;
a sense amplifier portion that detects data of one of the memory cells via one of the first wiring lines; and
a connecting portion having a first region and a first impurity region, and including a plurality of transistors in the first region, one of the transistors having a first terminal electrically connected to a certain memory cell of the memory cells and a second terminal electrically connected to the sense amplifier portion, and the first impurity region being disposed outside the first region and including an impurity of a first conductivity type,
the connecting portion including: a first transistor group configured from transistors of the plurality of transistors that are aligned in a first direction, the first direction being as their channel width direction; and a second transistor group configured from transistors of the plurality of transistors that are aligned in a second direction intersecting the first direction, the second direction being as their channel width direction, and
at least one of first terminals of the transistors of the second transistor group being disposed more distant than at least one of second terminals of the transistors of the second transistor group from the first impurity region.

13. The semiconductor memory device according to claim 12, wherein at least one of first terminals of the transistors of the first transistor group is disposed more distant than at least one of second terminals of the transistors of the first transistor group from the first impurity region.

14. The semiconductor memory device according to claim 12, wherein
one of the transistors of the connecting portion includes:
a gate electrode;
a second impurity region and a third impurity region that are disposed on a first terminal side of the gate electrode, the second impurity region including an impurity of a second conductivity type different from the first conductivity type, and the third impurity region including an impurity of the second conductivity type in a lower concentration than does the second impurity region; and
a fourth impurity region disposed on a second terminal side of the gate electrode and including an impurity of the second conductivity type.

15. The semiconductor memory device according to claim 12, wherein
the sense amplifier portion includes: a first sense amplifier array disposed on one side in the second direction of the memory device; and a second sense amplifier array disposed on the other side in the second direction of the memory device, and
the connecting portion includes: a first connecting portion disposed between the memory cell array and the first sense amplifier array; and a second connecting portion disposed between the memory cell array and the second sense amplifier array.

16. The semiconductor memory device according to claim 12, wherein
the memory cell array is divided into a plurality of memory cell blocks aligned in the second direction, and
the connecting portion is shared by the memory cell blocks.

17. The semiconductor memory device according to claim 12, wherein the connecting portion includes a plurality of the first transistor groups.

18. The semiconductor memory device according to claim 12, wherein the connecting portion includes a plurality of the second transistor groups.

19. The semiconductor memory device according to claim 18, wherein the second transistor groups sandwich the first transistor group in the second direction and are disposed at both ends of the first region.

20. The semiconductor memory device according to claim 12, wherein
- one of the transistors of the connecting portion includes a gate electrode,
- the gate electrodes of the transistors of the first transistor group are integrated, and
- the gate electrodes of the transistors of the second transistor group are integrated.

\* \* \* \* \*